United States Patent
Kobayashi et al.

(10) Patent No.: US 6,828,163 B2
(45) Date of Patent: Dec. 7, 2004

(54) WAFER SHAPE EVALUATING METHOD AND DEVICE PRODUCING METHOD, WAFER AND WAFER SELECTING METHOD

(75) Inventors: Makoto Kobayashi, Nishishirakawa-gun (JP); Kazuhito Matsukawa, Tokyo (JP); Hidekazu Yamamoto, Tokyo (JP); Shinroku Maejima, Tokyo (JP)

(73) Assignees: Shin-Etsu Handotai Co., Ltd., Tokyo (JP); Mitsubishi Denki Kabushiki Kaisha, Tokyo (JP)

(*) Notice: Subject to any disclaimer, the term of this patent is extended or adjusted under 35 U.S.C. 154(b) by 28 days.

(21) Appl. No.: 10/203,882

(22) PCT Filed: Nov. 15, 2001

(86) PCT No.: PCT/JP01/09981

§ 371 (c)(1),
(2), (4) Date: Aug. 15, 2002

(87) PCT Pub. No.: WO02/41380

PCT Pub. Date: May 23, 2002

(65) Prior Publication Data

US 2003/0023402 A1 Jan. 30, 2003

(30) Foreign Application Priority Data

Nov. 16, 2000 (JP) ........................................ 2000-350151
Sep. 14, 2001 (JP) ........................................ 2001-280501

(51) Int. Cl.[7] ............................. H01L 21/00; G06F 19/00
(52) U.S. Cl. ............................. 438/14; 700/121; 702/81
(58) Field of Search ............................. 438/14, 5, 7–9, 438/16–18; 700/121; 702/81–84; 428/64.1

(56) References Cited

U.S. PATENT DOCUMENTS

| 4,510,176 A | * | 4/1985 | Cuthbert et al. ............ 438/780 |
| 5,400,548 A | * | 3/1995 | Huber et al. .................. 451/41 |
| 5,420,796 A | | 5/1995 | Weling et al. ............... 364/468 |
| 5,618,461 A | | 4/1997 | Burke et al. ................. 219/502 |
| 5,783,804 A | | 7/1998 | Burke et al. ................. 219/494 |
| 5,835,225 A | | 11/1998 | Thakur ......................... 356/381 |

FOREIGN PATENT DOCUMENTS

| JP | H11-287630 | 10/1999 |
| JP | H11-351857 | 12/1999 |
| JP | 2000-146569 | 5/2000 |
| JP | 2000-292152 | 10/2000 |

OTHER PUBLICATIONS

International Search Report for PCT/JP01/09981 dated Feb. 19, 2002.

* cited by examiner

Primary Examiner—Evan Pert
(74) Attorney, Agent, or Firm—Rader, Fishman & Grauer PLLC

(57) ABSTRACT

There are provided a method and an apparatus for evaluating a wafer configuration which can accurately evaluate a peripheral portion of a wafer as compared with the conventional SFQR or the like, which comprises: measuring a configuration of a wafer at positions with a prescribed space within a surface of the wafer; providing a first region (W1) within the wafer surface for calculating a reference line or a reference plane from the measured wafer configuration; calculating a reference line (10a) or a reference plane (10b) in the first region (W1); providing a second region (W2) to be evaluated outside the first region; extrapolating the reference line (10a) or reference plane (10b) to the second region (W2); analyzing a difference between the configuration of the second region and the reference line or reference plane within the second region; and calculating the analyzed difference as surface characteristics.

44 Claims, 9 Drawing Sheets

WAFER SHAPE EVALUATING METHOD AND DEVICE PRODUCING METHOD, WAFER AND WAFER SELECTING METHOD

TECHNICAL FIELD

The present invention relates to a method and an apparatus for evaluating a configuration of a wafer represented by a silicon wafer. The present invention also relates to a semiconductor device fabricating method, especially to a wafer enabling improvement in a yield in a device fabricating process using an exposure system, and a sorting method for the same.

BACKGROUND ART

Conventionally, a method for manufacturing a silicon wafer used as a semiconductor substrate material generally comprises a crystal growth process for producing a single crystal ingot by a Czochralski (CZ) method, a floating zone melting (FZ) method or the like, and a wafer manufacturing process for manufacturing a wafer by slicing this single crystal ingot and processing at least one main surface thereof into a mirror-like surface. To describe the process more detailedly, the wafer manufacturing process comprises, a slicing step of slicing the single crystal ingot to obtain a thin and disk-shaped wafer; a chamfering step of chamfering a peripheral edge portion of the wafer obtained through the slicing step to prevent cracking and chipping of the wafer; a lapping step of flattening this wafer; an etching step of removing machining deformation remaining in the so chamfered and lapped wafer; a polishing step of making a mirror surface of the wafer; and a cleaning step of cleaning the polished wafer to remove a polishing agent or dust particles deposited thereon. The main steps of the wafer manufacturing process are only listed above, and sometimes other steps such as a heat treatment step may be added, or the step sequence may be changed.

Recently, an integration level in a semiconductor device has been becoming increasingly higher because of the remarkable progress in the semiconductor device technology, and with this progress, a demand for quality of a silicon wafer or the like has also been becoming more severe. A semiconductor device is fabricated by using a mirror-polished wafer which has been subjected to the single crystal producing process and the wafer manufacturing process. In the device fabricating process, a step of forming a resist pattern is repeatedly performed 20 to 30 times. Recently, a higher integration level and higher performance in a semiconductor integrated circuit has been advanced remarkably, and in company with this tendency, more miniaturization of circuit patterns is required. Taking a DRAM (dynamic random access memory) as an example, in a 64M bit DRAM that is now in quantity production, a resist pattern of 0.25 μm to 0.20 μm is drawn. In a photolithography step, a KrF excimer laser (wavelength=248 nm) of ultraviolet radiation is used as a light source most frequently. Further, with miniaturization of patterns, also improvement in dimension accuracy and overlay accuracy is required. With this progress, also a demand for quality of a silicon wafer or the like used as a base for a device has been becoming more severe.

That is, this is because a higher integration level of a semiconductor device has brought out miniaturization of a device size, and for instance, slight undulation or the like on a silicon wafer may lead to errors in a device pattern during the photolithography step or other steps. In addition, in order to effectively use a wafer, there is required a wafer which has excellent flatness up to the utmost outer peripheral portion (the very limit of the chamfered portion) of its main surface.

As one of the important characteristics required to the silicon wafer as described above, there is a problem of shape quality thereof. The wafer shape quality includes various parameters such as a diameter, a thickness, parallelism, flatness, irregularities with a relatively longer cycle named sori, bow, warp or the like, irregularities with a cycle of several mm named undulation and surface roughness; recently, it is frequently evaluated by quality named global flatness or site flatness based on a back side reference or a front side reference as an index of flatness.

Especially, as the index of flatness, the global flatness based on the back side reference is named GBIR (Global Back Ideal Range); this is usually defined, assuming that a reference plane is prepared within a wafer surface, as a width between the maximum positional displacement and the minimum positional displacement against the reference plane, and corresponds to TTV (Total Thickness Variation) which is a conventional specification.

Also, the site flatness based on the back side reference is named SBIR (Site Back Ideal Range), and corresponds to LTV which was quite frequently used in the past. When a back surface of a wafer is used as a reference plane and further at each site a plane including a center of the site is employed as a focal plane, the SBIR is a sum of absolute values of the respective maximum displacements in the plus side and minus side from the focal plane in the site, which is evaluated for each site. Usually, in case of an 8-inch wafer or the like, this value is evaluated in an area having a site of the order of 20 mm×20 mm. The size of this site varies depending upon a diameter or specifications of a wafer.

Moreover, the site flatness based on the front side reference is named SFQR (Site Front Least Squares Range); this is a sum of absolute values of the respective maximum displacements in the plus side and minus side from the reference plane which is a flat plane in a site obtained by calculating data with the method of least squares, which is evaluated for each site within a prescribed site.

Further, quality named nanotopography has been taken seriously. The nanotopography (also named nanotopology) means irregularities with a wavelength of the order of from 0.1 mm to 20 mm and an amplitude of the order of from several nm to 100 nm; the evaluation method therefor is performed by evaluating a difference of altitude of irregularities (a PV value; peak to valley) on a wafer surface in a range of a square block having a side of the order of from 0.1 mm to 10 mm, or of a circular block having a diameter of the order of from 0.1 mm to 10 mm (this range is named WINDOW SIZE or the like). This PV value is also named Nanotopological Height or the like. As the nanotopography, it is desired that the maximum value of the irregularities present within the evaluated wafer surface is small. Usually, this value of a wafer is evaluated by the maximum value among PV values obtained through evaluation of a plurality of blocks with a square having a side of 10 mm, and when this value is 60 nm or less, it is determined that the evaluated wafer is a good chip.

Up to a design rule of 0.18 μm in the device fabricating process, it was enough to manufacture a wafer that meets standard requirements under evaluation with the above-mentioned index, but as recently the design rule has been becoming increasingly severe with a specification of 0.15 μm or even 0.13 μm, when a wafer that meets the above standard requirements was used for fabricating an actual device, there sometimes took place decrease of its yield. Accordingly, there are required a wafer manufacturing method and a wafer evaluating method in which a wafer is prescribed by factors other than the above-mentioned indexes and specifications of severe design rules are carried out without any problem.

Especially, with the above-mentioned GBIR, SBIR, SFQR, or the like, although flatness at the middle side portion of a wafer can be precisely evaluated, flatness at a peripheral portion thereof, especially a portion in the vicinity of a boundary between a chamfered portion and a main surface of a wafer is sometimes not evaluated precisely.

For instance, in the device fabricating process, many processing machines such as an exposure system and other machines are used, and compatibility between a wafer holding chuck used in each machine and a configuration of a wafer to be processed has been becoming an issue. Matching between undulation and a peripheral shape of the chuck and those of the wafer is important, but it is impossible to evaluate the matching by the conventional indexes such as GBIR, SBIR, and SFQR.

There are now required indexes which can precisely evaluate the compatibility and the like between each device fabricating process, more particularly a chuck used in each processing machine and a wafer to be processed. Especially, when a severe specification of the design rule is applied to a wafer, it is necessary to more precisely evaluate the peripheral portion of the wafer.

Especially, there is a stepper (a popular name of a reduction projection step and repeat exposure system) wherein a wafer is stepped and exposed repeatedly to a projected figure through a mask pattern (a reticle patter); it was not necessarily possible to sort out wafers which are usable in the stepper in terms of configurations thererof by indexes such as SFQR. The same is also true for a scanning exposure system.

DISCLOSURE OF THE INVENTION

With the foregoing difficulties of the prior art in view, it is an object of the present invention to provide a method and an apparatus for evaluating a wafer configuration which, by evaluating quality of a wafer configuration from a different viewpoint from the conventional SFQR or the like, are capable of more precisely evaluating the peripheral portion of the wafer to manufacture a wafer suitable for each device fabricating process and improve production efficiency in the device fabricating process and the subsequent processes.

Another object of the present invention is to provide a device fabricating method, a wafer, and a wafer sorting method which, by evaluating quality of a wafer configuration from a different viewpoint from the conventional SFQR or the like using the above-mentioned evaluating method and apparatus, are capable of more precisely evaluating undulation on a wafer surface and the peripheral portion of a wafer to supply a wafer suitable for each device fabricating process, especially a process using an exposure system, and improve production efficiency in the device fabricating process and subsequent processes.

In order to achieve the above object, a first aspect of a method for evaluating a wafer configuration according to the present invention comprises the steps of: measuring a configuration of a wafer at positions with a prescribed space within a surface of the wafer; providing a first region within the wafer surface for calculating a reference line or a reference plane from the measured wafer configuration; calculating a reference line or a reference plane in the first region; providing a second region to be evaluated outside the first region; extrapolating the reference line or reference plane to the second region; analyzing a difference between the configuration of the second region and the reference line or reference plane within the second region; and calculating the analyzed difference as surface characteristics.

In the above inventive method, the second region is provided in a range of from a boundary of the first region to an edge portion of the wafer, differences (actually measured values—reference values) between configurations at a plurality of arbitrary positions within the second region (actually measured values) and the reference lines or reference planes at the positions (reference values) are analyzed, and the maximum value among the values of the analyzed differences (the positive maximum displacement amount or the positive maximum thickness difference) is calculated as the surface characteristic A (rise). (Note that this surface characteristic A (rise) may be called parameter A.)

In the above inventive method, the second region is provided in a range of from a boundary of the first region to an edge portion of the wafer, differences (actually measured values—reference values) between configurations at a plurality of arbitrary positions within the second region (actually measured values) and the reference line or reference plane at the positions (reference values) are analyzed, and the minimum value (the negative maximum value) among the values of the analyzed differences is calculated as the surface characteristic B (sag). (Note that this surface characteristic B (sag) may be called parameter B.).

A second aspect of the method for evaluating wafer configuration according to the present invention comprises the steps of: measuring a configuration of a wafer at positions with a prescribed space within a surface of the wafer; providing a first region on the wafer surface for calculating a reference line or a reference plane from the measured wafer configuration; calculating a reference line or a reference plane in the first region; obtaining differences between the reference line or the reference plane and actually measured values within the first region; and calculating a standard deviation a of the obtained differences as the surface characteristic C (undulation). (Note that the surface characteristic C (undulation) may be called parameter C).

Here, the wafer configuration measured at a plurality of positions with a prescribed space within the wafer surface is displacement (height or roughness) in the direction vertical to the wafer surface or a wafer thickness. Evaluation on the displacement in the direction vertical to the wafer surface makes it possible to perform evaluation based on the front side reference. Further evaluation on the wafer thickness makes it possible to perform evaluation based on the back side reference.

It is preferable to make the reference line of from the vicinity of the central portion of the wafer to a boundary of the first region within the first region by reading a configuration profile (that is, obtaining a configuration profile) of from the central portion of the wafer to the edge portion thereof.

The surface characteristics are preferably analyzed with a value obtained by averaging configuration profiles of from the central portion of the wafer to the edge portion thereof which are read at a plurality of positions on the wafer surface.

It is also possible to analyze the surface characteristics from respective configuration profiles which are read at a plurality of positions of from the central portion of the wafer to the edge portion thereof, and obtain an average value from a plurality of the analyzed surface characteristics.

Further, the reference plane of the first region is preferably made from data that are read within the extensive wafer surface of from the central portion of the wafer to the edge portion thereof.

In the conventional SFQR or the like, a wafer surface is divided into areas (sites) each about 20 mm square in which a reference plane is prepared for evaluation, but in this case, since a reference plane is prepared in a narrow area to be averaged, it is often impossible to accurately evaluate deterioration of an actual configuration or the like. Especially, in this conventional evaluating method, a configuration of the peripheral portion of the wafer cannot be evaluated accurately.

In the method according to the present invention, as shown in FIG. 1, a reference line or a reference plane is prepared in a global (extensive) region (a first region) for calculating a reference line or a reference plane from a basic configuration of a wafer; the reference line or reference plane is used by extrapolating it to a region to be evaluated such as the peripheral portion of the wafer (a second region) for analyzing the surface characteristics of the second region, or the reference line or reference plane is used in the first region to analyze the surface characteristics in the first region. Measuring a difference between the reference line or reference plane and the actual configuration, the measured maximum value is evaluated as a rise (A in FIG. 1), the measured minimum value as a sag (B in FIG. 1), and the dispersion of roughness in the first region (C in FIG. 1) as undulation. The undulation in the present invention is evaluated and quantified from a different point of view of the conventional undulation.

In other words, in the method according to the present invention, a reference line or a reference plane is prepared in an extensive specified region (a first region) on a wafer surface, which is an area larger than at least the site to be evaluated by the conventional SFQR or the like; the surface characteristics in the first region or in a region to be evaluated (a second region) other than the first region is evaluated based on the reference line or reference plane prepared in the extensive specified region (the first region).

As for the evaluation reference, a two-dimensional reference plane and a straight or curved reference line may be used, but it is necessary to use such a value as represents a whole (global) wafer configuration.

An apparatus for evaluating wafer a configuration according to the present invention comprises: a configuration measuring unit for measuring a configuration of a wafer at positions with a prescribed space on a surface of the wafer; a storage device for successively inputting and storing configuration data measured by the configuration measuring unit; and a surface characteristic calculating unit for reading the configuration data of from the central portion of the wafer to the edge portion thereof from the storage device, calculating a reference line or a reference plane in a region of from the central portion of the wafer to an arbitrary portion thereof, analyzing a difference between the reference line or the reference plane and an arbitrary position, and calculating the analyzed difference as surface characteristics.

The above-mentioned configuration measuring unit is preferably a displacement measuring unit for measuring displacement in the direction vertical to a surface of a test stand of a surface of the wafer placed on the test stand within a wafer surface, or a thickness measuring unit for measuring a thickness of a wafer held by a wafer holding jig within the wafer surface. The apparatus according to the present invention is advantageously used for carrying out the method according to the present invention.

In a device fabricating method according to the present invention, when fabricating a device on a wafer with an exposure system, the device is fabricated using the wafer having the surface characteristic A (rise) of 150 nm or less calculated by the above-mentioned evaluating method and apparatus.

Thus, the effect of rise in the peripheral portion of a wafer is great in the device fabricating process using an exposure system; it is preferable to make a value of the surface characteristic A (rise) obtained by the above-mentioned evaluating method as small as possible. Especially, it is effective to fabricate a device using an exposure system with a wafer of A=150 nm or less. It is preferable to make the rising components as small as possible, but it is not preferable to make sagging too large, so that the lower limit thereof is about −20 nm.

Further, when fabricating a device with an exposure system, it is preferable to fabricate the device using the wafer having the surface characteristic B (sag) of −300 nm or less, especially of −300 nm to −900 nm calculated by the above-mentioned evaluating method and apparatus.

It is most important for the wafer used in an exposure system to have no rise at the peripheral portion thereof, but too large sagging is not preferable, and the degree of slight sagging is preferable. Thus, there is very preferable for device fabrication a wafer of the order of −300 nm to about −900 nm, especially of the order of −500 nm to −600 nm with the above-mentioned indexes.

The wafer according to the present invention has the surface characteristic A (rise) of 150 nm or less and the surface characteristic B (sag) of −300 nm or less.

In brief, it is preferable that the surface characteristic A (rise) is 150 nm or less and the surface characteristic B (sag) is −300 nm or less in a wafer used in the device fabricating process with an exposure system.

Since the conventional wafer is not evaluated by the above-mentioned indexes, many sags are found in the peripheral portion thereof. For instance, in the conventional wafer the above parameter A is negative (−200 nm or less) and the parameter B is −700 nm or less. When the sags are eliminated from a wafer, the wafer is apt to have a rising configuration and the above parameter A becomes 200 nm or more.

However, since it is difficult to satisfy the above-mentioned wafer quality by the usual polishing, in the present invention the wafer peripheral portion is polished especially carefully to manufacture the wafer having the parameter ranges as described above.

There could be conceivably various methods for meeting the above requirements: for instance, a first method in which a work is polished in a state that a coating film made of material having a polishing rate slower than that of a work is formed on the work peripheral portion to adjust a polishing rate thereon; a second method in which a work is polished in a manner that an improved means for holding a work is employed, that is the size of a work holding plate is improved, or a work is chucked at its peripheral portion by a work holding plate with a hard central portion of a work holding region and a soft peripheral portion thereof, and a third method in which a front surface of a work is polished in a manner that a back coating is formed on a back surface of a work and the work is held at the back coating, and in this method peripheral sags can also be controlled by differentiating the thickness of the back coating between the peripheral portion of the wafer and the central portion thereof to change the polishing pressure on the peripheral portion thereof.

Further there are a fourth method in which a diameter of a wafer before the primary polishing is made larger than that of the finished product and sags in the peripheral portion are controlled by chamfering the wafer with decreasing the diameter thereof after the primary polishing; a fifth method in which a wafer is polished in such a way that by improving the polishing head the pressing force against the peripheral portion of a work is controlled independently from the central portion thereof; and a sixth method completely different from the above methods in which a peripheral configuration of a work is controlled by plasma etching the peripheral portion thereof after polishing.

However, even if a wafer is polished carefully under the manufacturing methods described above, it is frequently necessarily impossible to manufacture the wafer satisfying the above parameters A and B with certainty.

Accordingly, manufactured wafers are sorted before fabricating devices with them. That is, the wafer sorting method according to the present invention is for sorting a wafer on which devices are fabricated with an exposure system, wherein there is sorted the wafer having the surface characteristic A (rise) of 150 nm or less evaluated by the above-mentioned evaluating method.

Likewise, a wafer is evaluated and sorted in terms of the parameter B. That is, the inventive wafer sorting method is for sorting a wafer on which devices are fabricated with an exposure system, wherein further there is sorted the wafer having the surface characteristic B (sag) of −300 nm or less evaluated by the above-mentioned evaluating method.

Thus, by sorting wafers polished in the wafer manufacturing process, there can be obtained wafers more suitable for the device fabricating process, and the fabrication yield can further be improved.

In addition, fine irregularities on a wafer surface named nanotopography are becoming a problem, too. The same information as the above quality can be evaluated by using the surface characteristic C (undulation) of the inventive evaluating method too; the surface characteristic C (undulation) of 20 nm or less may lead to a wafer with an excellent surface state. The values for the surface characteristics are evaluated using data obtained by setting a boundary (an arbitrary position X) between the first region and the second region to a position of 30 mm away from the peripheral edge of the wafer; measurement of a wafer configuration is based on the data obtained by excluding the area with 1 mm in width along the peripheral portion of the wafer (excluding the chamfered portion).

BEST MODE FOR CARRYING OUT THE INVENTION

Embodiments of a method for evaluating a wafer configuration according to the present invention and an apparatus used for carrying out the method are described in detail below with reference to the accompanying drawings.

Figure 2:
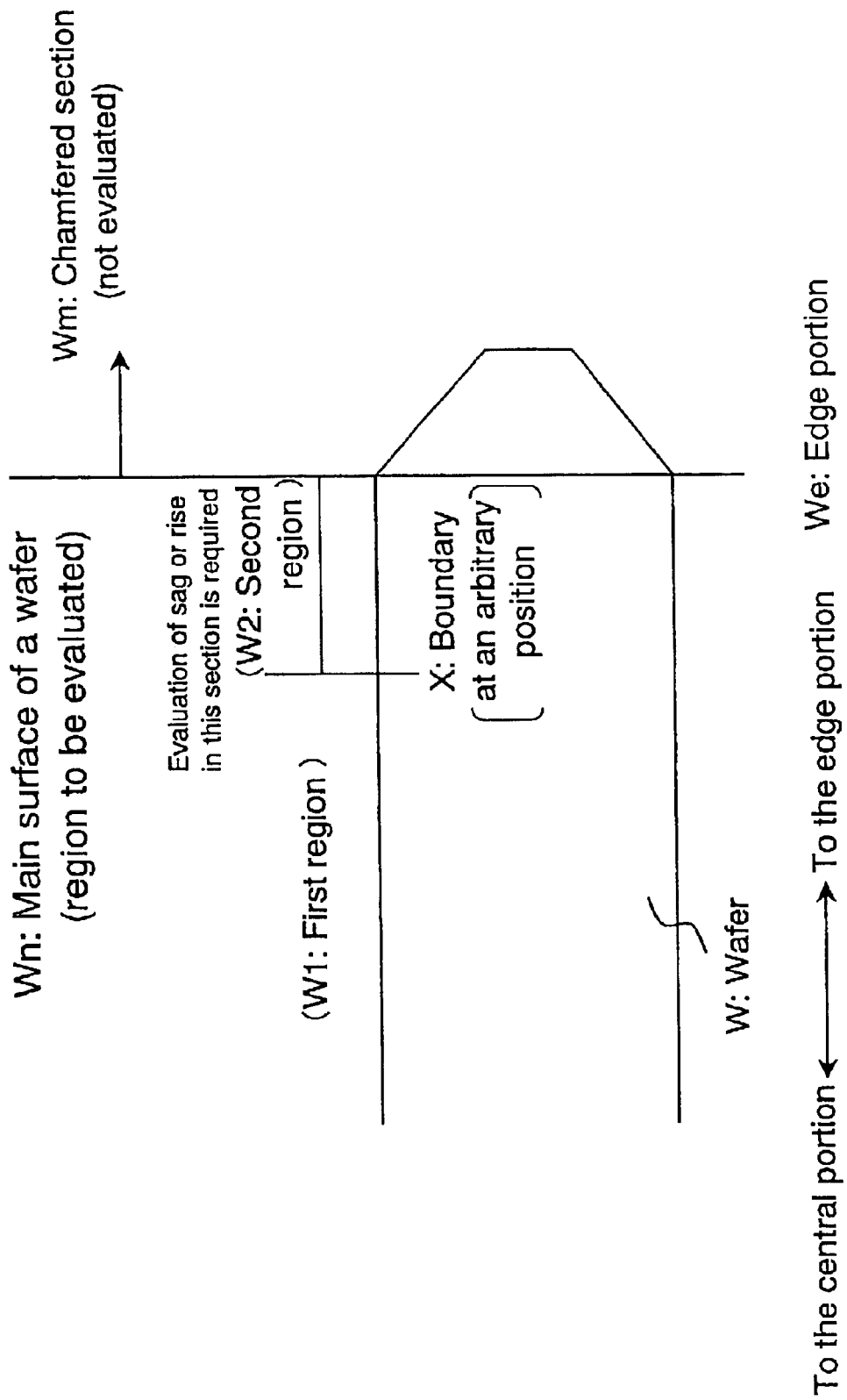
FIG. 2 is an explanatory view showing the first region and the second region in the method for evaluating a wafer configuration according to the present invention.

FIG. 2 shows schematically a configuration of a wafer W. Generally, a peripheral edge portion of the wafer W is chamfered to prevent cracking or the like, a chamfered portion Wm being formed. Usually, this chamfered portion Wm is ignored in evaluating a wafer configuration, and out of an object of measurement.

Evaluating a wafer configuration is often performed on a region of a main surface Wn of the wafer W which is formed by excluding an area with the width of about 3 mm or about 2 mm from the chamfered portion Wm of the wafer W. However, recently it is required to evaluate the region which is formed by excluding an area with the width of 1 mm from the chamfered portion or the region to the very limit of the boundary between the main surface and the chamfered portion. Considering measuring precision and the like, in the present state it is preferable to evaluate the region formed by excluding an area with the width of 1 mm from the chamfered portion Wm.

Figure 1:
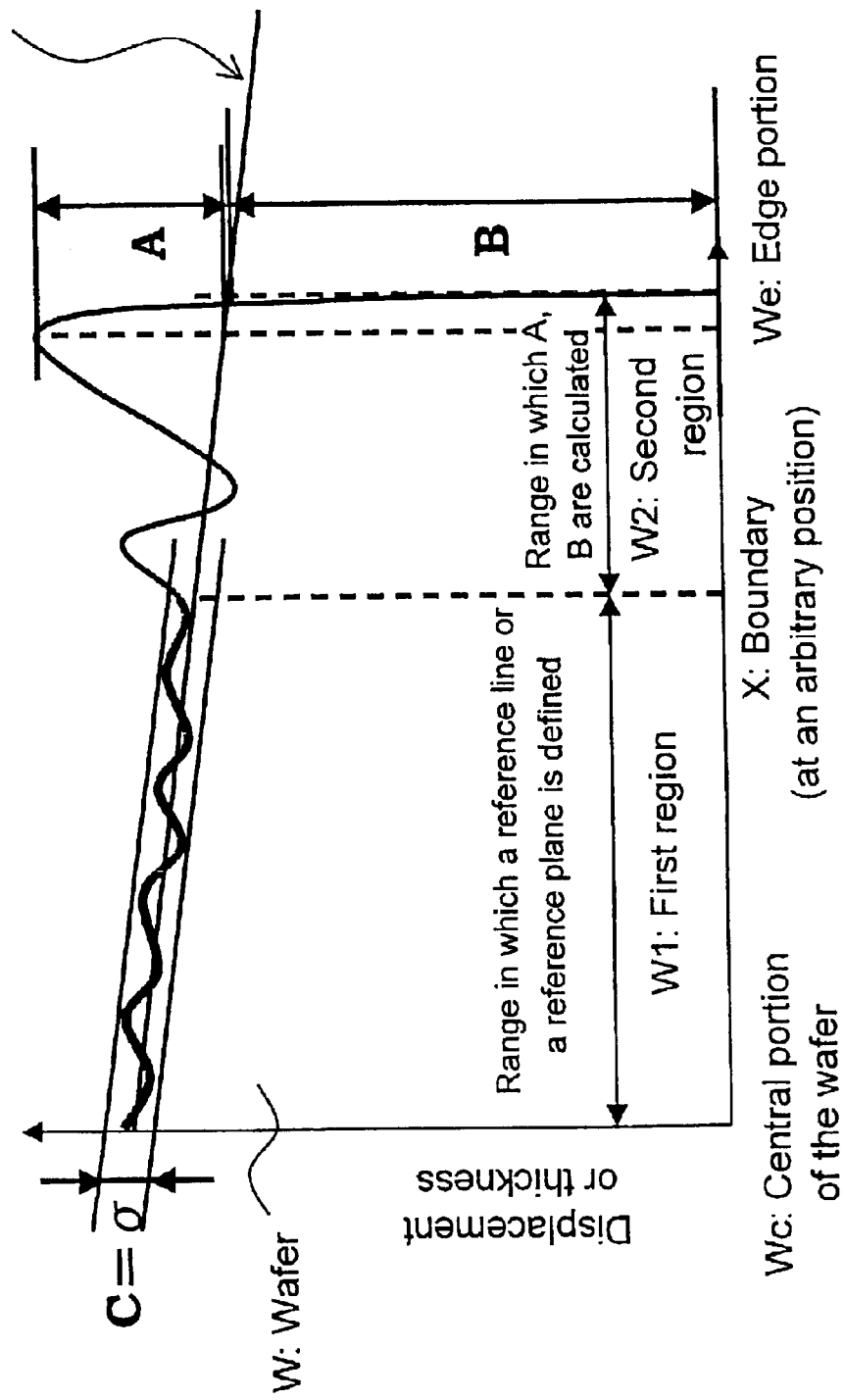
FIG. 1 is an explanatory view showing schematically three-dimensional relations between the reference line and the first region and the second region in the method for evaluating a wafer configuration according to the present invention.

FIG. 1 schematically shows displacement in thickness of a surface of a wafer W. A main purpose of the method for evaluating a wafer configuration according to the present invention is to quantify rise or sag which is easily generated on an area with the width of about 10 mm of the peripheral portion of the wafer (10 mm from the chamfered portion Wm).

In the method for evaluating a wafer configuration according to the present invention, as shown in FIG. 1, a reference line 10a or a reference plane 10b is prepared within an extensive region (a first region) W1 for calculating the reference line 10a or the reference plane 10b in a wafer surface from the basic configuration of the wafer W; the reference line 10a or the reference plane 10b is extrapolated to a region (a second region) W2 to be evaluated on the peripheral portion of the wafer, and is used thereon for analyzing the surface characteristics of the second region W2, or is used in the first region W1 for analyzing the surface characteristics of the regions W2 or W1.

Differences between the reference line 10a or the reference plane 10b and an actual configuration of the wafer are measured, and the measured maximum value is evaluated as rise A, the measured minimum value is evaluated as sag B, and dispersion C of roughness in the first region W1 is evaluated as undulation. It is to be noted that, in FIG. 1, designated by Wc is a central portion of a wafer, We is an edge portion of the wafer, and X is a boundary between the first region W1 and the second region W2, which is provided at an arbitrary position.

Figure 3:
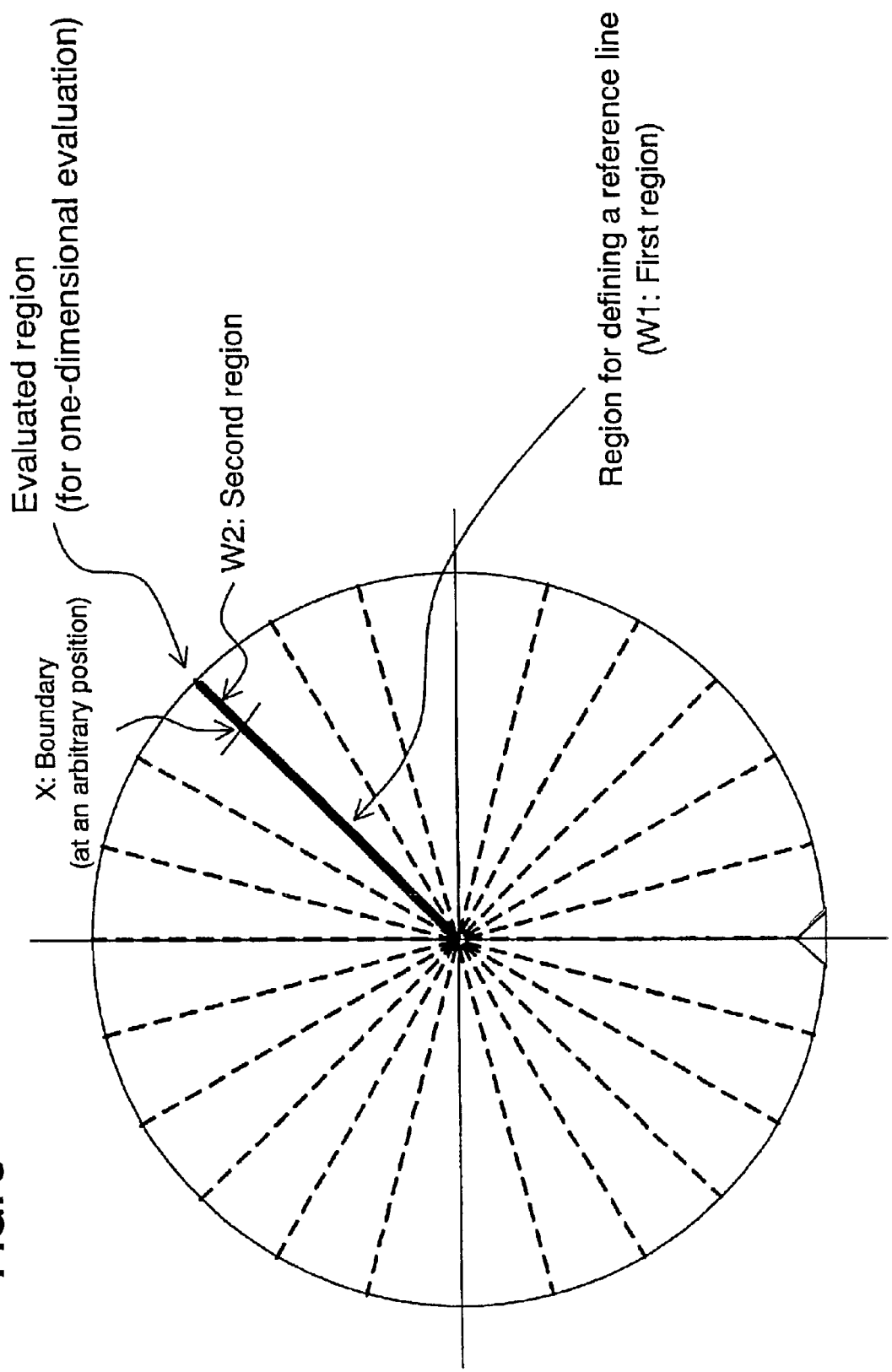
FIG. 3 is an explanatory view showing an example of a one-dimensional region for evaluation in the method for evaluating a wafer configuration according to the present invention.

In the method for evaluating a wafer configuration by preparing a reference line, a configuration of a wafer is measured at positions with a prescribed space on a surface of the wafer; the measured wafer configuration are successively stored; a configuration profile of from the central portion Wc of the wafer W to the edge portion We thereof as shown in FIG. 3 is read from the stored configuration; there is calculated a reference line up to a boundary X of the first region W1 provided at an arbitrary position away from the central portion (in the radial direction of the wafer); and then a difference between a configuration at an arbitrary position (in the direction of the wafer thickness) and a value of the reference line 10a at this position is analyzed to be calculated as the surface characteristics.

The reference line may be approximated by a straight line or a curved line most well reflecting a configuration of the central portion of the wafer W, but usually the central portion of the wafer W is polished to a high flatness level, so that the reference line is fully approximated by the straight line.

Here, an arbitrary position X of a boundary between the first region W1 and the second region W2 is preferably provided at an arbitrary position in the radial direction of the wafer W and in an area (as extensive as possible) of the wafer W where no peripheral sag nor rise is generated. For instance, usually sags and the like occur in the area outside of about 10 mm away from the peripheral edge of the wafer, so that the arbitrary position (boundary) X should preferably be provided at a position of about 30 mm away from the peripheral edge of the wafer. It is preferable to prepare a reference line or a reference plane at a position of 70 mm away from the central portion of the wafer in the case of an 8 inch wafer (200 mm in diameter) and at a position of 120 mm away from the central portion in the case of a 12 inch wafer (300 mm in diameter). However, this position may be freely changed according to the wafer size and others so that the wafer quality can be evaluated most accurately.

In the method of calculating the specific surface characteristics to be evaluated by preparing a reference line, a configuration profile of a wafer W of from the central portion Wc to the edge portion We is read; a reference line of from the central portion Wc to an arbitrary position X is calculated; then there is analyzed a difference between a configuration at an arbitrary position in the range of from the arbitrary position X to the edge portion We (an actually measured value) and a reference line (a reference value) at this position [a configuration at an arbitrary position (an actually measured value)—a reference line at an arbitrary position (a reference value)]; and the maximum value among the analyzed values (usually the positive maximum displacement amount or the maximum thickness difference) is calculated as the surface characteristic A (rise). This surface characteristic A quantitatively indicates a rising configuration on the peripheral portion of the wafer.

Also, a configuration profile of from the central portion Wc of the wafer W to the edge portion We is read; a reference line of from the central portion to an arbitrary position X is calculated; then there is analyzed a difference between a configuration at an arbitrary position in the range of from the arbitrary position X to the edge portion We (an actually measured value) and a reference line (a reference value) at this position [a configuration at an arbitrary position (an actually measured value)—a reference line at an arbitrary position (a reference value)]; and the minimum value among the analyzed values (usually the negative maximum value) is calculated as the surface characteristic B (sag). This surface characteristic B quantitatively indicates a sagging configuration on the peripheral portion of the wafer.

Further, a configuration profile of from the central portion Wc of the wafer W to the edge portion We (excluding the chamfered portion Wm) is read; a reference line of from the central portion to the arbitrary position X is calculated, then a difference between the reference line (a reference value) and a configuration from the central portion to the arbitrary position X (an actually measured value) is obtained; and the dispersion of the obtained values is calculated as the surface characteristic C (undulation). This surface characteristic C quantitatively indicates an undulating configuration and a flatness level of the central portion of the wafer.

When the whole wafer is evaluated by means of the one-dimensional analysis, providing a plurality of radial measuring positions as indicated by the dotted line in FIG. 3, configuration profiles of from the central portion Wc to the edge portion We (excluding the chamfered portion Wm) are read from the plurality of positions on the wafer surface, and an average of the read values may be used for analysis of the surface characteristics. In other words, a plurality of configuration profiles on the wafer surface may be read to previously obtain an average value of the configuration profiles (an average configuration profile), and the surface characteristics may be analyzed from the average configuration profile. The surface characteristics are analyzed on the basis of the configuration profile of from the central portion Wc to the edge portion We and then the average value thereof may be obtained, too. With the above evaluating method, it is possible to eliminate unnecessary noises such as taper components of a wafer. When a configuration profile of a wafer is analyzed radially along about 400 lines (about 1 degree apart), the information on the whole surface of the wafer can be evaluated more accurately.

Figure 4:
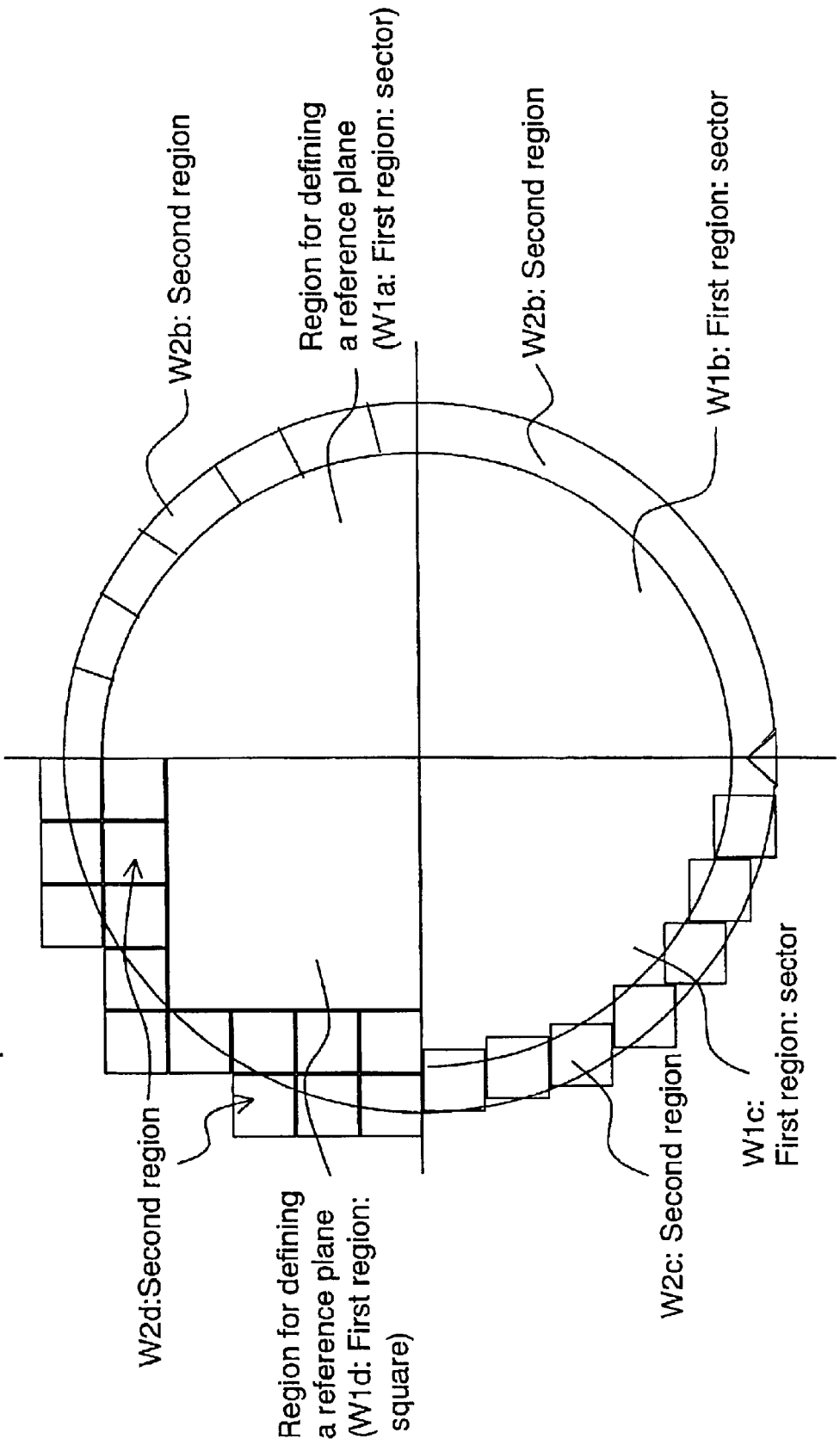
FIG. 4 is an explanatory view showing an example of a two-dimensional region for evaluation in the method for evaluating a wafer configuration according to the present invention.
Figure 5:
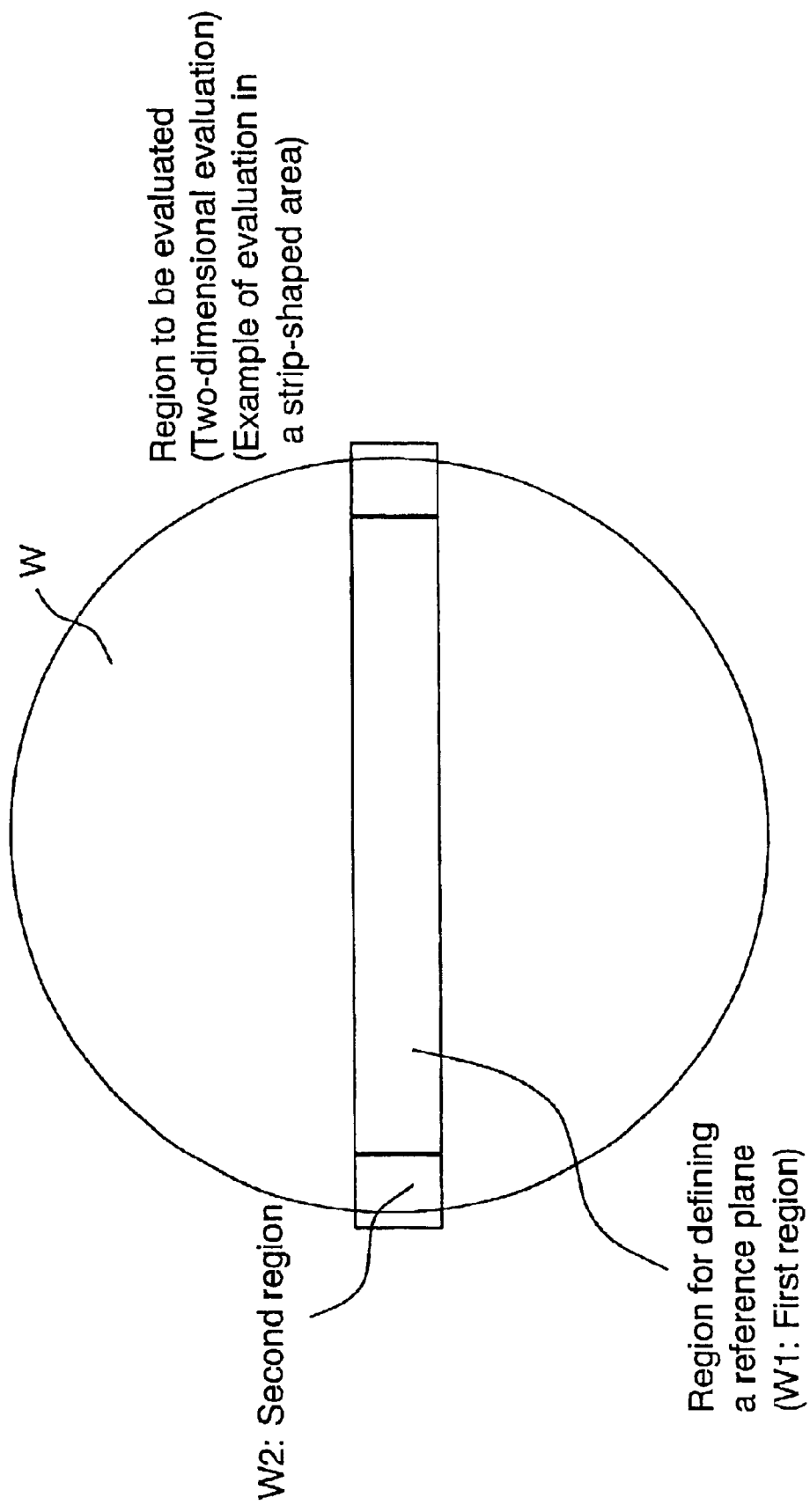
FIG. 5 is an explanatory view showing another example of a two-dimensional region for evaluation in the method for evaluating a wafer configuration according to the present invention.

In the method for evaluating a wafer configuration by preparing a reference plane 10b, the whole surface of the wafer W as shown in FIG. 4 is divided into, for instance, four regions; in each of the divided regions reference planes are prepared on extensive first regions W1a, W1b, W1c, and W1d (with any form including a square or a sector) in a central portion of the wafer; differences in terms of the configuration between the reference planes and arbitrary planes (second regions W2a, W2b, W2c, and W2d to be evaluated with any form including a square or a whole peripheral portion) are analyzed to be calculated as the surface characteristics. FIG. 4 shows various examples (four patterns) of how to provide the regions. In addition to the above example of the four divided regions, a first region W1 and a second region W2 are provided in a strip-shaped area divided on the surface of the wafer as shown in FIG. 5, and the differences in terms of the configuration between them may be analyzed to evaluate the surface characteristics of the wafer.

Also when evaluation is performed by preparing the reference plane 10b as in analysis using the reference line 10a, data for the extensive first region of from the central portion Wc of the wafer W to the edge portion We thereof is read; a reference plane of from the central portion to an arbitrary area is calculated; then there is analyzed a difference between a second region to be evaluated on the peripheral portion of the wafer W and the reference plane 10b (a configuration at an arbitrary position—a reference plane at the arbitrary position); and the maximum value among the analyzed values (usually the positive maximum displacement amount or the maximum thickness difference) is calculated as the surface characteristic A (rise). Likewise the minimum value (usually the negative maximum value) in the second region is calculated as the surface characteristic B (sag). Further the dispersion of the roughness in the extensive first region in the central portion of the wafer from the reference plane is calculated as the surface characteristic C (undulation).

The prescribed measurement space on the wafer surface should be preferably within 1 mm. The space is naturally more than 0 mm, but evaluation is performed with the space being smaller, more accurate configuration can be quantified.

By making use of the surface characteristics, evaluation of wafer configuration can be performed more accurately than the conventional evaluation, so that the yield in the subsequent processes can be improved.

Figure 6:
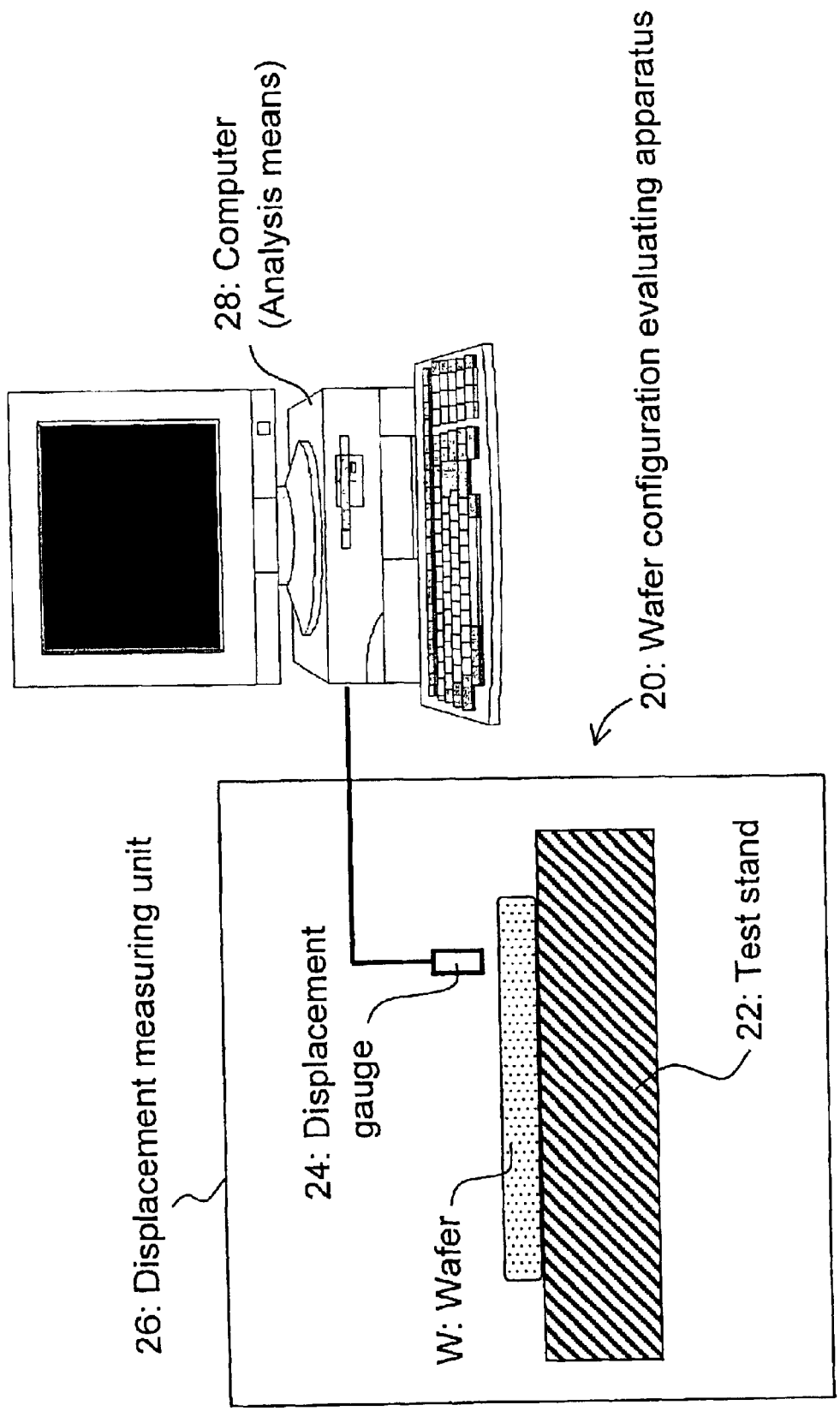
FIG. 6 is a schematic side view showing an essential structure of a first embodiment of an apparatus for evaluating a wafer configuration according to the present invention.

Next, an evaluating apparatus for performing the above analysis is described below. FIG. 6 is a schematic explanatory view showing an essential structure of the first embodiment of the apparatus for evaluating wafer configuration according to the present invention. An apparatus 20 for evaluating a wafer configuration shown in FIG. 6 is an apparatus used for measurement and analysis of displacement of a surface of a wafer W, which comprises a test stand 22, and a displacement measuring unit 26 having a displacement gauge 24 equipped with a laser oscillator or an automatic focusing mechanism, a computer 28, etc., and optically measures shifts in the distance from the previously calibrated reference point as the displacement. In the embodiment shown in FIG. 6, the displacement measuring unit 26 functions as a configuration measuring unit.

The test stand 22 is a stand used for placing thereon a silicon wafer W as an object to be measured. The displacement gauge 24 is an apparatus for irradiating a laser beam with a prescribed space onto a surface of a silicon wafer W placed on the test stand 22, and for instance, a HeNe laser or the like is used as the laser beam. The displacement gauge 24 is equipped with an automatic focusing mechanism (not shown), and this automatic focusing mechanism is provided with, for instance, a CCD (Charge Coupled Device) camera (not shown), an automatic focusing circuit (not shown), and others, and can automatically focus on an image reflected from the silicon wafer of the laser beam which is emitted from the laser oscillator.

The displacement gauge 24 measures the displacement from a reference point when focused by the automatic focusing mechanism, and inputs the displacement data into the computer 28.

The computer 28 is equipped with a CPU (Central Processing Unit), an RAM (Random Access Memory), an ROM (Read Only Memory), etc. The computer 28 into which the displacement data output from the displacement gauge 24 are input, reads the analysis program stored in the ROM using the RAM as a work area, and calculates the surface characteristics A, B, and C of the wafer quality according to the present invention from the input displacement data with the CPU. The surface characteristics are parameters especially used for evaluation of a peripheral portion of the wafer.

In other words, the computer 28 comprises a storage means for successively inputting and storing configuration data obtained by the displacement measuring unit (the configuration measuring unit) 26, and a surface characteristic calculating unit for reading the configuration data of from the central portion of the wafer W to the edge portion thereof from the storage device, calculating a reference line or a reference plane from the central portion of the wafer to an arbitrary portion, then analyzing a difference between the reference line or the reference plane and an arbitrary position, and calculating the analyzed difference as the surface characteristics.

Figure 7:
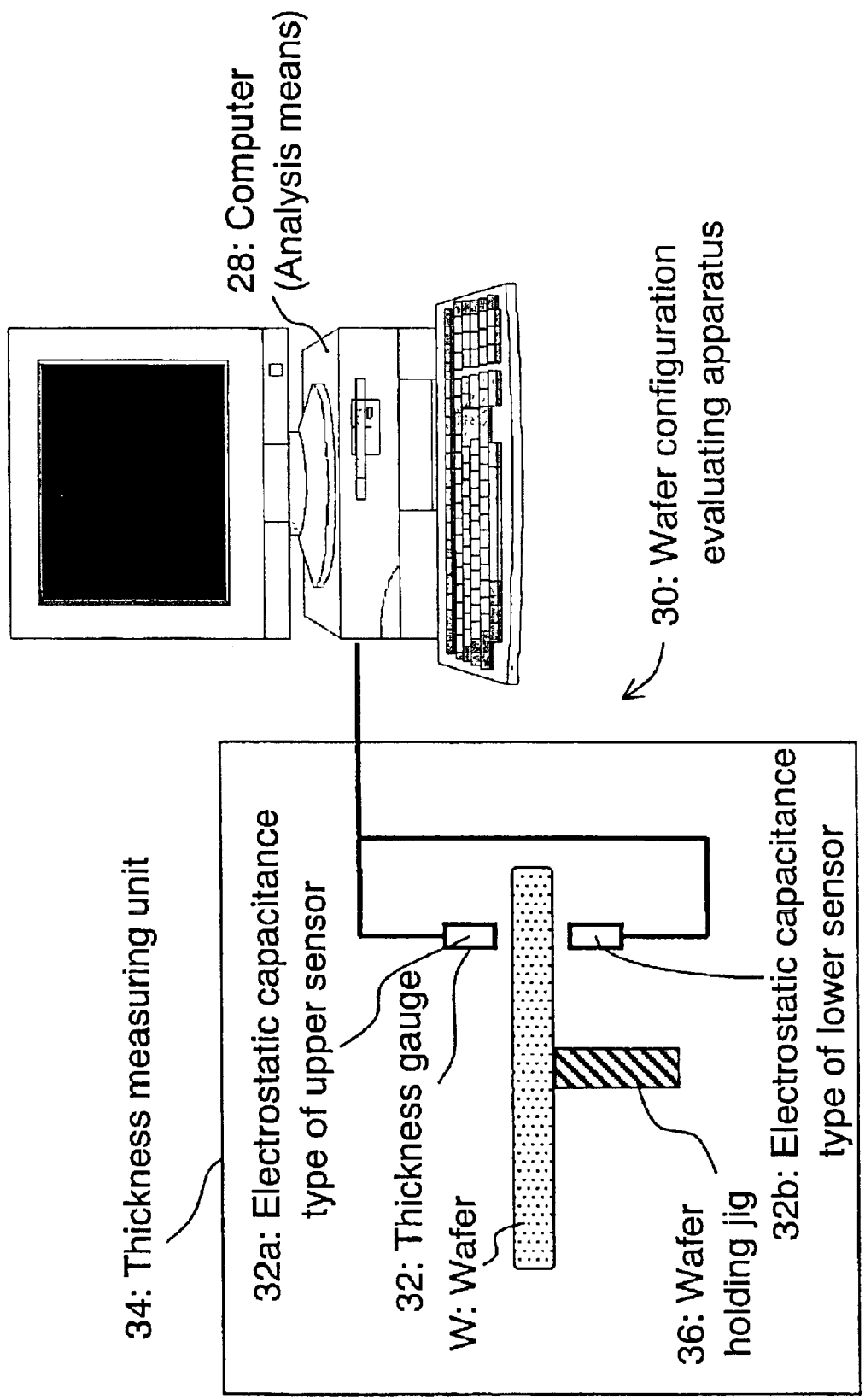
FIG. 7 is a schematic side view showing an essential structure a second embodiment of an apparatus for evaluating a wafer configuration according to the present invention.

FIG. 7 is a schematic explanatory view showing an essential structure of a second embodiment of the apparatus for evaluating a wafer configuration according to the present invention. In another embodiment for the apparatus for evaluating a wafer configuration, a thickness may be measured with a flatness measuring unit based on an electrostatic capacitance system in place of displacement of the wafer surface. The flatness measuring unit based on the electrostatic capacitance system is used as a thickness measurement unit 34 equipped with a thickness gauge 32 comprising electrostatic capacitance type of upper and lower sensors 32a, 32b arranged such that the wafer W is held between them as shown in FIG. 7, and measures the thickness of the wafer W by measuring the distances between the sensors 32a, 32b and upper and lower surfaces of the wafer W, respectively. As the flatness measuring unit based on the electrostatic capacitance system, a commercial non-contact type of wafer thickness, flatness and BOW/WARP measuring unit such as Ultra Gauge 9900 produced by ADE Corp. may be used.

The apparatus 30 for evaluating a wafer configuration shown in FIG. 7 comprises a wafer holding jig 36 for holding a wafer W, the above-mentioned thickness measuring unit 34, and a computer 28, and is used for measuring a thickness of the wafer W. In the embodiment shown in FIG. 7, the thickness measuring unit 34 functions as a configuration measuring unit.

Thus, any type of evaluating apparatus may be used without any specific limitation, provided that it can finely and accurately evaluate configurations (irregularities) of the wafer W.

The surface characteristics A, B and C are evaluated on the basis of the displacement or thickness measured as described above. Specifically, the reference line or reference plane is a line or a plane calculated by means of the method of least squares using data for all points on a region where a reference is to be prepared. Therefore, it is preferable that the finer becomes the space with which data are to be sampled. Specifically, a proper range for the space should be 1 mm or less.

The configuration evaluation using the surface characteristics A, B and C actually calculated by the apparatus for evaluating a wafer configuration according to the present invention is described below. FIG. 1 is a view showing values for the surface characteristics A, B and C of a given wafer, and a configuration profile on a cross section thereof. An analysis program of the surface characteristics calculating means is software in which an equation for calculating the surface characteristics A, B and C is programmed.

In the analysis program, as for the surface characteristic A, thickness data of a mirror polished silicon wafer are read with an arbitrary space (about 1 mm) on the silicon wafer from the central portion thereof toward the edge portion; then a reference line (or a reference plane) is prepared using the thickness data in an extensive first region by means of the method of least squares; differences (actually measured values—reference values) between the reference line (reference values) and a configuration (actually measured values) in a second region to be evaluated are calculated, and the maximum value within the area is analyzed.

As for the surface characteristic B, thickness data of a mirror polished silicon wafer are read with an arbitrary space (about 1 mm) on the silicon wafer from the central portion thereof toward the edge portion; then a reference line (or a reference plane) is prepared using the thickness data in an extensive first region by means of the method of least squares; differences (actually measured values—reference values) between the reference line (reference values) and a configuration (actually measured values) in a second region to be evaluated are calculated, and the minimum value within the area is analyzed.

As for the surface characteristic C, thickness data of a mirror polished silicon wafer are read with an arbitrary space (about 1 mm) on the silicon wafer from the central portion thereof toward the edge portion; then a reference line (or a reference plane) is prepared using the thickness data in an extensive first region by means of the method of least squares; a standard deviation of differences (actually measured values—reference values) between the reference line (reference values) and a configuration (actually measured values) in the first region to be evaluated is analyzed.

In the apparatus for evaluating a wafer configuration according to the present invention as described above, displacement data measured using a laser beam or thickness data measured using an electrostatic capacitance type of thickness gauge are read into a computer, and the surface characteristics A, B and C are calculated by analyzing the read data with the computer.

As described above, according to the present invention, a surface configuration of a wafer, especially a peripheral portion thereof can be evaluated accurately on the basis of a specific standard from a different viewpoint from the conventional techniques such as SFQR. In addition, it is possible to evaluate more effective information as compared to the conventional evaluation for the wafer configuration, and hence the yield in the subsequent processes such as the device fabricating process can be improved. Moreover, the surface characteristics can be fully used as parameters for analysis of various experimental data, too.

When evaluating a configuration of a silicon wafer, by combining the above surface characteristics A, B and C with other conventional types of evaluation parameters such as flatness of SFQR or the like and surface roughness, a configuration of a silicon wafer can be evaluated more completely.

Figure 8:
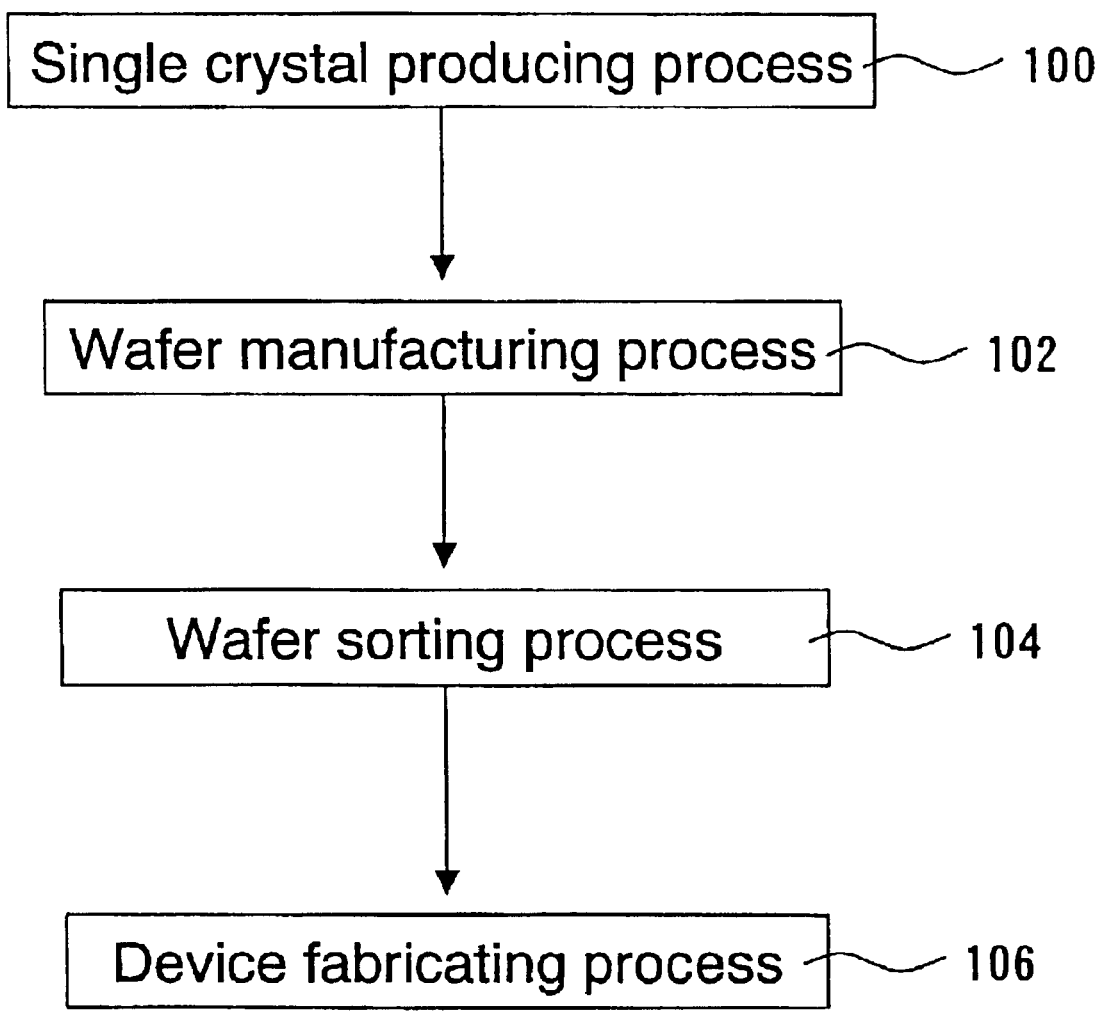
FIG. 8 is a flow chart showing an example of a process sequence in a device fabricating method according to the present invention.

The device fabricating method according to the present invention is described in detail below with reference to FIG. 8 of the accompanying drawings. FIG. 8 is a flow chart showing an example of a process sequence in a device fabricating method according to the present invention. As shown in this figure, roughly speaking, the device fabricating method according to the present invention comprises a single crystal producing process 100, a wafer manufacturing process 102, a wafer sorting process 104, and a device fabricating process 106.

In the device fabricating process 106 for a semiconductor integrated circuit, a semiconductor substrate such as a silicon wafer (including an untreated semiconductor substrate and a processed or treated substrate in the course of a semiconductor process) is selectively subjected to various types of treatment such as etching, ion implantation or others.

Here, to selectively protect a silicon wafer or the like as a base layer to be treated, a coating film of a so-called photosensitive resist (referred to as a "resist" hereinafter) made of a composition having sensitivity to radiant rays such as ultraviolet rays, X rays, or an electron beam is formed on the substrate, and after that patterning is completed by performing exposure (herein this term broadly means to expose the resist film not only to visible light but also to radiant rays such as ultraviolet rays or an electron beam) to the radiant rays. That is, a resist pattern is formed on the semiconductor substrate through a photolithography process.

The resist pattern formation method most commonly used is to perform exposure using a reduction projection exposure system (a stepper) with a g-line (wavelength=436 nm) of a mercury lamp, an i-line (wavelength=365 nm) thereof or a KrF excimer laser (wavelength=248 nm) as a light source. Here, a photomask is attached to the stepper, and then exposure is performed. The photomask, also named reticle, comprises a glass substrate on which a pattern (such as a metallization pattern) to be transferred is drawn as a mask pattern with a shielding film made of such as chromium (Cr). In case of exposure, accurate alignment (overlay) is performed between the photomask and a circuit pattern already formed on the semiconductor substrate.

The mask pattern drawn on the photomask is projected with the light emitted from the light source (herein the tem "light" includes not only visible light, but also ultraviolet rays or the like), and the projected light passes through a lens provided in the stepper. With this structure, the mask pattern is transferred with a reduced size onto the resist coated on the semiconductor substrate. Then the resist is subjected to development to form a resist pattern. Types of resist are divided into a positive type and a negative type. In the positive type of resist, an irradiated portion thereof is dissolved in a developing solution, while the not-irradiated portion is not dissolved, and in contrast, in the negative type of resist, the irradiated portion thereof is not dissolved in a developing solution, while the not-irradiated portion is dissolved.

In the device fabricating process 106, the step of forming a resist pattern is repeated usually 20 to 30 times. However, the device fabricating process 106 is not limited to the above-mentioned example.

The device fabricating method according to the present invention resides in that there is specified a wafer which is used in the device fabricating process 106 using the above-mentioned exposure system, wherein the surface characteristic A (rise) is calculated by the above-mentioned evaluating method, and a device is fabricated using a wafer having the calculated value of 150 nm or less.

In the device fabricating process using an exposure system, rises in the peripheral portion of a wafer give severe influences, and it is preferable that the value of the surface characteristic A (rise) obtained through the above-mentioned evaluating method is smaller. Especially, it is effective to fabricate a device using an exposure system with a wafer having the value of the surface characteristic A of 150 nm or less.

Further, by using a wafer with the value of the surface characteristic B (sag) of –300 nm or less, preferably from –300 nm to –900 nm, more preferably from –500 nm to –600 nm, yield in device fabrication can be improved. Although it is most important for a wafer used in an exposure system that there is no rise on the peripheral portion thereof, over-sagging is not preferable, and slight sagging is preferable. The wafer of the order of from –300 nm to –900 nm based on the above index is very preferable for device fabrication.

There is no specific limitation for the wafer manufacturing method, but attention should be paid to a configuration of a peripheral portion of a wafer during manufacturing.

An example of silicon wafer manufacturing method is described below. At first, a single crystal ingot is produced by, for instance, the Czochralski method (single crystal producing process 100). This single crystal ingot is sliced, and at least one main surface thereof is processed into a mirror-like surface. To describe a wafer manufacturing process 102 more detailedly, the wafer manufacturing process 102 comprises, a slicing step of slicing the single crystal ingot with an inner diameter saw, a wire saw and the like to obtain a thin and disk-shaped wafer; a chamfering step of chamfering a peripheral edge portion of the wafer obtained through the slicing step to prevent cracking and chipping of the wafer; a lapping step or a surface grinding step of flattening this wafer; an etching step of removing machining deformation remaining in the so chamfered and lapped wafer; a polishing step of making a mirror surface of the wafer; and a cleaning step of cleaning the polished wafer to remove a polishing agent or dust particles deposited thereon. The main steps of the wafer manufacturing process 102 are only listed above, and sometimes other steps such as a heat treatment step may be added, the step sequence may be changed, or the same step may be repeated in a plurality of stages.

In the above sequence of wafer processing steps, any processing method may be applied to the various respective steps, but attention should be paid to a configuration of a finally obtained wafer. Especially, care should be taken to polishing conditions in the polishing step to obtain an ideal wafer. Although various processing methods may be applicable in the polishing step too, by polishing a wafer under control over a polishing pressure loaded to a peripheral portion thereof and a polishing rate, a configuration of the wafer, especially that of the peripheral portion thereof is controlled. Note that in the present invention the wafer manufacturing process is not limited to the above-mentioned one, and any wafer manufacturing process may be usable so long as the parameters A and B fall within the scope of the present invention.

With the above-mentioned process, it is possible to manufacture with a high probability a wafer with few sags in the peripheral portion and having the parameters A and B of the order of A=150 nm to −20 nm and B=−300 nm to −900 nm. Note that the above-mentioned surface characteristic values are based on evaluation of data obtained when setting a boundary (an arbitrary position X) between the first region and second region at a position 30 mm away from the peripheral edge of the wafer, and measuring a configuration of the wafer excluding an area with the width of 1 mm from the peripheral edge of the wafer (excluding the chamfered portion thereof).

However, it is not always possible to obtain a wafer satisfying the above required value range, and hence there is performed the above-mentioned evaluation for a wafer used in the device fabricating process 106 according to the present invention, the wafer being further sorted in the wafer sorting process 104.

In other words, as shown in FIG. 8, in the device fabricating method according to the present invention, after completion of a single crystal producing process 100 for producing an ingot and a wafer manufacturing process 102 for preparing a mirror-polished wafer are performed, the wafer sorting process 104 is performed according to the parameters A, B and C, and then a device is fabricated in the device fabricating process 106. In the evaluating method according to the present invention, the parameter values may change depending on where an arbitrary position X and a measuring region for a wafer configuration are set. When sorting wafers to be used in the device fabricating process using an exposure system, stable evaluation has been performed by setting an arbitrary position X of the inventive evaluating method at a position 30 mm away from the peripheral edge of the wafer, and measuring a configuration of the wafer excluding an area with the width of 1 mm from the peripheral edge of the wafer (excluding the chamfered portion thereof). Wafers currently manufactured have a high flatness level, and even if the arbitrary position X is slightly displaced from the preferred position, the parameter values change little. However, when the arbitrary position X is set at a position about 10 mm away from the peripheral edge of the wafer, the parameter values may largely change, so that it is preferable to set the arbitrary position X at a position inner toward the center of the wafer from a position about 20 mm away from the peripheral edge of the wafer. These requirements are applicable to a wafer having a different diameter from the above-mentioned wafer. Even in case of a wafer having a different diameter from the above-mentioned wafer, it is preferable to set the arbitrary position X at a position about 30 mm away from the peripheral edge of the wafer.

EXAMPLES

The present invention will be further described more detailedly by way of the following examples which should be construed illustrative rather than restrictive.

Inventive Example 1

8-inch mirror-polished wafers (200 mm in diameter and 0.5 mm in width of a peripheral edge portion being a chamfered portion) manufactured through various manufacturing processes (6 kinds) were evaluated by the evaluating method according to the present invention.

In the 6 kinds of wafer manufacturing processes (processes S1 to S6), different conditions were established in the etching step, surface grinding step and others. As for the yield in a device fabricating process, the above manufacturing processes are arranged in the order of S5>S6>S1>S4>S2>S3, and the process S5 was best, while a wafer manufactured in the process S3 was worst.

The evaluating method according to the present invention was used to evaluate what type of a wafer configuration is preferable for improving the yield in the device fabricating process. The analysis was performed through the method for evaluating a wafer configuration by preparing a reference line. There were analyzed 400 configuration profiles within the wafer surface.

In each analysis, the wafer thickness was measured at positions with a space of 0.95 mm on the whole surface of the wafer (excluding the chamfered portion of an area with 0.5 mm in width of the peripheral portion); the measured wafer thickness data were successively stored; configuration profiles of the wafer of from the central portion to the edge portion (98.5 mm away from the central portion) as shown in FIG. 1 were read from the stored wafer thickness data; a reference line was calculated using the values from the central portion (in the direction of the wafer diameter) to an arbitrary position X (70 mm) by the method of least squares; then the difference between the thickness at the arbitrary position and the value of the reference line (a virtual thickness) at the same position was analyzed; and the analyzed difference was calculated as the surface characteristics. In other words, the surface characteristics A and B are the maximum value and minimum value in the second region to be evaluated of 70 mm to 98.5 mm, respectively. The surface characteristic C indicates dispersion of the values in the extensive first region of from the central portion to 70 mm.

Figure 9:
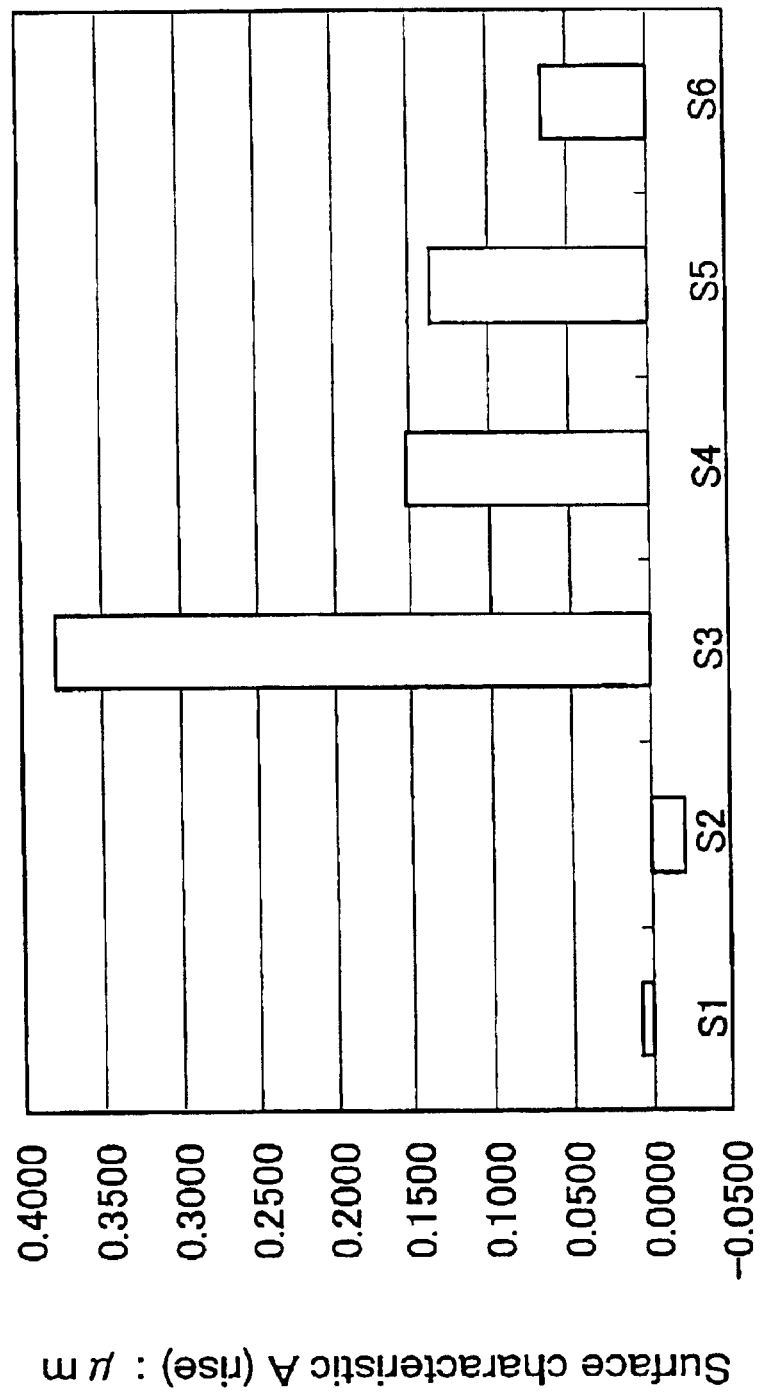
FIG. 9 is a graph showing an evaluation result of the surface characteristic A in various manufacturing processes in Inventive Example 1.

Results of the evaluation are shown in Table 1 and in FIG. 9. These results were obtained in such a way that in configuration profiles each of from a central portion of the wafer to an edge portion thereof, at first surface characteristics were calculated and then average values of surface characteristics radially evaluated of 400 lines were determined.

TABLE 1

| Manu-facturing Process | Surface Character-istic: A (rise) ($\mu$m) | Surface Character-istic: B (sag) ($\mu$m) | Surface Character-istic: A – B ($\mu$m) | Surface Character-istic: C (undulation) ($\mu$m) | Yield Ranking (in order of goodness) |
|---|---|---|---|---|---|
| S1 | 0.0089 | −0.5377 | 0.5466 | 0.0060 | 3 |
| S2 | −0.0215 | −0.8108 | 0.7893 | 0.0118 | 5 |
| S3 | 0.3791 | −0.2452 | 0.6244 | 0.0205 | 6 |
| S4 | 0.1519 | −0.5161 | 0.6679 | 0.0213 | 4 |
| S5 | 0.1367 | −0.5947 | 0.7314 | 0.0198 | 1 |
| S6 | 0.0650 | −0.8287 | 0.8937 | 0.0158 | 2 |

According to Table 1, the wafer manufactured in S3 with the worst yield is small and good in sagging components (the surface characteristic B in the evaluating method according to the present invention), but as shown in Table 1 and FIG. 9, remarkably worse in rising components (the surface characteristic A in the evaluating method according to the present invention) as compared to wafers manufactured in other manufacturing methods. Thus, it is understood that the evaluating method according to the present invention evaluates qualities of a wafer more accurately.

It is found that this device fabricating process is affected easily by rises more than by sags of a wafer configuration, and the fabrication yield can be improved by using a wafer having no rise. Also in this Inventive Example it is known that the wafer having the values for sag and rise similar to the level of the manufacturing process S5 shown in Table 1 is preferable.

This device fabricating process is a process using an exposure system, and from Table 1 a preferable wafer for the device fabricating process using the exposure system has no rising component and the parameter A of 0.150 $\mu$m (150 nm) or less. When the parameter A is equal to or less than 0, the wafer has a configuration with big sagging components rather than rising components, so that the preferable parameter A is of from −20 nm to 150 nm. The parameter B does not exert a greater effect on the yield with an exposure system as compared to the parameter A, but to improve the yield, it is preferable that the parameter A is 0.150 $\mu$m (150 nm) or less and the parameter B is preferably in the order of from −300 nm to −900 nm, especially from −500 nm to −600 nm. The parameter C should be preferably 20 nm or less. This tendency was observed likewise in various types of exposure systems.

In each device fabricating process (and further in each processing unit), by establishing the optimum ranges of sag and rise according to the inventive evaluating method, a wafer suitable for each device fabricating process can be manufactured.

It is to be noted that the evaluating method according to the present invention is not limited to Inventive Example 1 described above. For instance, when preparing a reference line or a reference plane, data for a configuration of a wafer of from the central portion to an arbitrary position X are used for calculation, but the arbitrary position X is not always required to be set from the central portion. Although it is more accurate to use data obtained by setting the arbitrary position from the central portion, since a central portion of a wafer is usually polished to an extremely high flatness level, the reference position may be set from a point off-centered to some extent.

For instance, with an 8-inch wafer or the like, there has been obtained a similar result as compared to the case where a reference line or a reference plane is prepared from the central portion to an arbitrary position, even when displacement or thickness is measured on an area of from the central portion to a position of 23 mm to 98.5 mm, the position of 23 mm from the central portion is set as a starting point, and a reference line or a reference plane is prepared on the basis of a configuration profile of from the starting point to a position (an arbitrary position) 70 mm (30 mm away from the peripheral edge of the wafer).

In the above Inventive Example 1, there were mainly observed differences between data of the surface characteristic A, but as shown in Table 1 a wafer configuration can be evaluated by determining the surface characteristics B and C and a difference between the surface characteristics A, B, etc.; further a wafer configuration can be evaluated more accurately by combining fittingly the above evaluated indexes. It is most important for the inventive evaluating method to evaluate a mirror-polished wafer, but the evaluating method can be applied not only to the mirror-polished wafer, but also to wafers after having been subjected to lapping, etching, surface grinding or other steps.

Inventive Example 2

Then, to ascertain the information obtained from Table 1, wafers were manufactured by controlling the parameters A, B and C, and the wafers were sorted by the inventive evaluating method to manufacture wafers meeting the pre-scribed requirements. The evaluating method was the same as that employed in Inventive Example 1.

That is, by polishing wafers controlling the peripheral portions thereof, wafers having the parameter A of −20 nm to 150 nm and the parameter B of −300 nm to −900 nm were manufactured, and devices were fabricated using the wafers. There are various device fabricating processes, but in this example, a process using an exposure system, especially a stepper was performed.

In this example, there were used wafers (wafer group WS1) having the parameter A of 80 nm to 150 nm and the parameter B of −400 nm to −700 nm, and wafers (wafer group WS2) having the parameter A of −20 nm to 80 nm and the parameter B of −300 nm to −800 nm, provided that the above parameter values were evaluated according to the evaluating method described above. The wafers belonging to both the wafer groups have the parameter A of 150 nm or less. All of the wafers used in this example have the parameter C of 20 nm or less.

The device fabricating process using a stepper, especially a resist pattern formation process is described below. In this example, a commercially available positive type of resist is coated with the thickness of about 500 nm on the wafers sorted according to the inventive evaluating method, and then pre-baking is performed for 90 seconds at the temperature of 100° C. With this operation, the positive type of liquid resist is solidified.

Then, a reticle (photomask) with a pattern having various pitches (for instance, a metallization pattern) drawn thereon is set on a stepper equipped with a KrF excimer laser (wavelength=248 nm) as a light source for performing exposure. As a result, the pattern drawn on the reticle is transferred onto the positive type of resist.

Next, PEB (Post Exposure Baking) was performed for 90 seconds at the temperature of 110° C., and after that development was performed for 60 seconds using a 2.38 weight % aqueous solution of tetra methyl ammonium hydroxide (TMAH). As a result, a resist pattern corresponding to the pattern drawn on the reticle was obtained. Thus, a device was fabricated using the stepper.

The yield in the device fabricating process using a stepper was evaluated by checking shifts of the resist pattern (poor exposure). The yield was calculated by counting wafers with pattern shifts as inferior chips. 100 sheets of wafers were evaluated.

As a result, the yield of wafers of WS1 was 99%. In contrast, the yield of wafers of WS2 was 95%, slightly lower than WS1. The yield in either case was far higher than that in the conventional practice.

Comparative Example 1

With wafers (wafer group WS3) having the parameter A of 150 nm to 400 nm, the parameter B of –200 nm to –800 nm and the parameter C of 20 nm or less, devices were fabricated likewise in Inventive Example 2 to determine the yield.

As a result, the yield was 52%, remarkably worse as compared to wafers of WS1 and WS2. Especially, many pattern shifts were observed in the peripheral portions of the wafers. This result indicates that there is bad the yield in the device fabricating process with the wafers having large values for the parameter A (rising components).

By the way, when devices are fabricated with wafers which are manufactured by the conventional process and are not sorted according to the parameters A and B, the yield is around 70%. It has been known form the above that the yield is largely improved by using wafers meeting the standard requirements according the present invention.

As described above, in the device fabricating process using a stepper, the yield is affected by rise in a wafer configuration more than by sag therein, and therefore it is understood that by using wafers having no rise, the yield can be improved.

The parameter C of undulation components on a wafer surface is strongly related to nanotopography, and when the parameter C is 20 nm or less, the surface state of the wafer is excellent.

Capability of Exploitation in Industry

The typical effects of the present invention will be described below. Displacement or thickness of a wafer measured at positions with a prescribed space using the displacement or thickness measuring means can determine a wafer configuration more accurately than the conventional indexes for indicating flatness such as SFQR. Especially, there can be quantitatively evaluated a configuration of a peripheral portion of the wafer including the so-called rise or sag, so that the wafer configuration can be accurately evaluated according to a given criterion.

With the evaluating method according to the present invention, there can be quantitatively evaluated wafer quality, especially quality of a peripheral portion of a wafer which can not be evaluated accurately so far, and hence a wafer configuration most suitable to lithography or CMP can be determined.

By taking advantage of the surface characteristics obtained through the evaluating method according to the present invention, evaluation of a wafer configuration can be performed more accurately as compared to the conventional practice, and the yield in the subsequent processes can be improved. Further by accumulating these data, it becomes possible to easily grasp a capability or the like of the fabricating process, which makes it possible to supply wafers stably.

Especially, it has been confirmed that, when the parameters A, B and C of a wafer fall within given standard requirements, the yield in the device fabricating process using an exposure system can be greatly improved. Therefore, the yield in the device fabricating process can be improved by using wafers which are manufactured and further sorted so as to make the parameters A, B and C within the above standard requirements.

What is claimed is:

1. A method for evaluating a wafer configuration comprising the steps of:

measuring a configuration of a wafer at positions with a prescribed space within a surface of the wafer;

providing a first region within the wafer surface for calculating a reference line or a reference plane from the measured wafer configuration;

calculating a reference line or a reference plane in the first region as being representative of a whole wafer configuration;

providing a second region to be evaluated outside the first region;

extrapolating the reference line or reference plane to the second region;

analyzing a difference between the configuration of the second region and the reference line or reference plane within the second region; and calculating the analyzed difference as surface characteristics.

2. The method for evaluating a wafer configuration according to claim 1, wherein the second region is provided in a range of from a boundary of the first region to an edge portion of the wafer, differences between configurations at a plurality of arbitrary positions within the second region and the reference line or reference plane at the positions are analyzed, and the maximum value among the values of the analyzed differences is calculated as the surface characteristic A (rise).

3. The method for evaluating a wafer configuration according to claim 1, wherein the second region is provided in a range of from a boundary of the first region to an edge portion of the wafer, differences between configurations at a plurality of arbitrary positions within the second region and the reference line or reference plane at the positions are analyzed, and the minimum value among the values of the analyzed differences is calculated as the surface characteristic B (sag).

4. The method for evaluating a wafer configuration according to claim 1, wherein the wafer configuration measured at a plurality of positions with a prescribed space within the wafer surface is displacement in the direction vertical to the wafer surface or a wafer thickness.

5. The method for evaluating a wafer configuration according to claim 2, wherein the wafer configuration measured at a plurality of positions with a prescribed space within the wafer surface is displacement in the direction vertical to the wafer surface or a wafer thickness.

6. The method for evaluating a wafer configuration according to claim 3, wherein the wafer configuration measured at a plurality of positions with a prescribed space within the wafer surface is displacement in the direction vertical to the wafer surface or a wafer thickness.

7. The method for evaluating a wafer configuration according to claim 1, wherein the reference line of from the vicinity of the central portion of the wafer to a boundary of the first region is calculated within the first region by reading a configuration profile of from the central portion of the wafer to the edge portion thereof.

8. The method for evaluating a wafer configuration according to claim 2, wherein the reference line of from the vicinity of the central portion of the wafer to a boundary of the first region is calculated within the first region by reading a configuration profile of from the central portion of the wafer to the edge portion thereof.

9. The method for evaluating a wafer configuration according to claim 3, wherein the reference line of from the vicinity of the central portion of the wafer to a boundary of the first region is calculated within the first region by reading a configuration profile of from the central portion of the wafer to the edge portion thereof.

10. The method for evaluating a wafer configuration according to claim 7, wherein the surface characteristics are analyzed with a value obtained by averaging configuration profiles of from the central portion of the wafer to the edge portion thereof which are read at a plurality of positions on the wafer surface.

11. The method for evaluating a wafer configuration according to claim 8, wherein the surface characteristics are analyzed with a value obtained by averaging configuration profiles of from the central portion of the wafer to the edge portion thereof which are read at a plurality of positions on the wafer surface.

12. The method for evaluating a wafer configuration according to claim 9, wherein the surface characteristics are analyzed with a value obtained by averaging configuration profiles of from the central portion of the wafer to the edge portion thereof which are read at a plurality of positions on the wafer surface.

13. The method for evaluating a wafer configuration according to claim 7, wherein the surface characteristics are analyzed from respective configuration profiles which are read at a plurality of positions of from the central portion of the wafer to the edge portion thereof, and an average value is obtained from a plurality of the analyzed surface characteristics.

14. The method for evaluating a wafer configuration according to claim 8, wherein the surface characteristics are analyzed from respective configuration profiles which are read at a plurality of positions of from the central portion of the wafer to the edge portion thereof, and an average value is obtained from a plurality of the analyzed surface characteristics.

15. The method for evaluating a wafer configuration according to claim 9, wherein the surface characteristics are analyzed from respective configuration profiles which are read at a plurality of positions of from the central portion of the wafer to the edge portion thereof, and an average value is obtained from a plurality of the analyzed surface characteristics.

16. The method for evaluating a wafer configuration according to claim 1, wherein the reference plane of the first region is calculated from data which are read within the wafer surface of from the central portion of the wafer to the edge portion thereof.

17. The method for evaluating a wafer configuration according to claim 2, wherein the reference plane of the first region is calculated from data which are read within the wafer surface of from the central portion of the wafer to the edge portion thereof.

18. The method for evaluating a wafer configuration according to claim 3, wherein the reference plane of the first region is calculated from data which are read within the wafer surface of from the central portion of the wafer to the edge portion thereof.

19. The method for evaluating a wafer configuration according to claim 4, therein the reference plane of the first region is calculated from data which are read within the wafer surface of from the central portion of the wafer to the edge portion thereof.

20. The method for evaluating a wafer configuration according to claim 5, wherein the reference plane of the first region is calculated from data which are read within the wafer surface of from the central portion of the wafer to the edge portion thereof.

21. The method for evaluating a wafer configuration according to claim 6, wherein the reference plane of the first region is calculated from data which are read within the wafer surface of from the central portion of the wafer to the edge portion thereof.

22. A method for evaluating a wafer configuration comprising the steps of:
measuring a configuration of a wafer at positions with a prescribed space within a surface of the wafer;
providing a first region on the wafer surface for calculating a reference line or a reference plane from the measured wafer configuration;
calculating a reference line or a reference plane in the first region as being representative of a whole wafer configuration;
obtaining differences between the reference line or the reference plane and actually measured values within the first region; and
calculating a standard deviation $\sigma$ of the obtained differences as the surface characteristic C (undulation).

23. The method for evaluating a wafer configuration according to claim 22, wherein the wafer configuration measured at a plurality of positions with a prescribed space within the wafer surface is displacement in the direction vertical to the wafer surface or a thickness of the wafer.

24. The method for evaluating a wafer configuration according to claim 22, wherein the reference line of from the vicinity of the central portion of the wafer to a boundary of the first region is calculated within the first region by reading a configuration profile of from the central portion of the wafer to the edge portion thereof.

25. The method for evaluating a wafer configuration according to claim 23, wherein the reference line of from the vicinity of the central portion of the wafer to a boundary of the first region is calculated within the first region by reading a configuration profile of from the central portion of the wafer to the edge portion thereof.

26. The method for evaluating a wafer configuration according to claim 24, wherein the surface characteristics are analyzed with a value obtained by averaging configuration profiles of from the central portion of the wafer to the edge portion thereof which are read at a plurality of positions within the wafer surface.

27. The method for evaluating a wafer configuration according to claim 25, wherein the surface characteristics are analyzed with a value obtained by averaging configuration profiles of from the central portion of the wafer to the edge portion thereof which are read at a plurality of positions within the wafer surface.

28. The method for evaluating a wafer configuration according to claim 24, wherein the surface characteristics are analyzed from respective configuration profiles which are read at a plurality of positions of from the central portion of the wafer to the edge portion thereof, and an average value is obtained from a plurality of the analyzed surface characteristics.

29. The method for evaluating a wafer configuration according to claim 25, wherein the surface characteristics are analyzed from respective configuration profiles which are read at a plurality of positions of from the central portion of the wafer to the edge portion thereof, and an average value is obtained from a plurality of the analyzed surface characteristics.

30. The method for evaluating a wafer configuration according to claim 22, wherein the reference plane of the first region is calculated from data which are read within the wafer surface of from the central portion of the wafer to the edge portion thereof.

31. The method for evaluating a wafer configuration according to claim 23, wherein the reference plane of the first region is calculated from data which are read within the wafer surface of from the central portion of the wafer to the edge portion thereof.

32. The method for evaluating a wafer configuration according to claim 1, wherein the prescribed space is 1 mm or less.

33. The method for evaluating a wafer configuration according to claim 22, wherein the prescribed space is 1 mm or less.

34. An apparatus for evaluating a wafer configuration comprising:
a configuration measuring unit for measuring a configuration of a wafer at positions with a prescribed space on a surface of the wafer;
a storage device for successively inputting and storing configuration data measured by the configuration measuring unit; and
a surface characteristic calculating unit for reading the configuration data of from the central portion of the wafer to the edge portion thereof from the storage device, calculating a reference line or a reference plane as being representative of a whole wafer configuration in a region of from the central portion of the wafer to an arbitrary portion thereof, analyzing a difference between the reference line or the reference plane and an arbitrary position, and calculating the analyzed difference as surface characteristics.

35. The apparatus for evaluating a wafer configuration according to claim 34, wherein the configuration measuring unit is a displacement measuring unit for measuring displacement in the direction vertical to a surface of a test stand of a surface of the wafer placed on the test stand within the wafer surface, and the configuration data are displacement data.

36. The apparatus for evaluating a wafer configuration according to claim 34, wherein the configuration measuring unit is a thickness measuring unit for measuring a thickness of a wafer held by a wafer holding jig within the wafer surface, and the configuration data are thickness data.

37. A device fabricating method, wherein, when fabricating a device on a wafer with an exposure system, the device is fabricated using the wafer having the surface characteristic A (rise) of 150 nm or less evaluated by the evaluating method according to claim 2.

38. The device fabricating method according to claim 37, wherein, when fabricating a device on a wafer with an exposure system, the device is fabricated using the wafer having the surface characteristic B (sag) of −300 nm or less evaluated by the evaluating method according to claim 3.

39. The device fabricating method according to claim 37, wherein, when fabricating a device on a wafer with an exposure system, the device is fabricated using the wafer having the surface characteristic C (undulation) of 20 nm or less evaluated by the evaluating method according to claim 22.

40. The device fabricating method according to claim 38, wherein, when fabricating a device on a wafer with an exposure system, the device is fabricated using the wafer having the surface characteristic C (undulation) of 20 nm or less evaluated by the evaluating method according to claim 22.

41. A wafer sorting method for sorting a wafer on which devices are fabricated with an exposure system, wherein there is sorted the wafer having the surface characteristic A (rise) of 150 nm or less evaluated by the evaluating method according to claim 2.

42. The wafer sorting method according to claim 41, wherein further there is sorted the wafer having the surface characteristic B (sag) of −300 nm or less evaluated by the evaluating method according to claim 3.

43. The wafer sorting method according to claim 41, wherein further there is sorted the wafer having the surface characteristic C (undulation) of 20 nm or less evaluated by the evaluating method according to claim 22.

44. The wafer sorting method according to claim 42, wherein further there is sorted the wafer having the surface characteristic C (undulation) of 20 nm or less evaluated by the evaluating method according to claim 22.

* * * * *